US012770708B2

(12) United States Patent
Iwao

(10) Patent No.: US 12,770,708 B2
(45) Date of Patent: Oct. 20, 2026

(54) SEMICONDUCTOR DEVICE AND APPARATUS

(71) Applicant: CANON KABUSHIKI KAISHA, Tokyo (JP)

(72) Inventor: Koichi Iwao, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 80 days.

(21) Appl. No.: 18/979,797

(22) Filed: Dec. 13, 2024

(65) Prior Publication Data

US 2025/0226048 A1 Jul. 10, 2025

(30) Foreign Application Priority Data

Jan. 10, 2024 (JP) ................................ 2024-002047

(51) Int. Cl.
*G11C 29/44* (2006.01)

(52) U.S. Cl.
CPC ................................ *G11C 29/4401* (2013.01)

(58) Field of Classification Search
CPC ............................ G11C 29/4401; G11C 29/44
USPC .......................................................... 365/200
See application file for complete search history.

(56) References Cited

U.S. PATENT DOCUMENTS 6,208,569 B1 3/2001 Patel
6,246,618 B1 6/2001 Yamamoto
6,512,709 B1 1/2003 Nakahara et al.
8,743,637 B2 * 6/2014 Matsuo ................ G11C 29/848 365/200
10,346,240 B2 * 7/2019 Han ...................... G06F 11/073
12,174,698 B2 * 12/2024 Kan ...................... G11C 29/12
2009/0044045 A1 * 2/2009 Kohara ................ G11C 29/848 714/E11.091

FOREIGN PATENT DOCUMENTS

JP 2000231795 A 8/2000
JP 2001014885 A 1/2001
JP 2002014875 A 1/2002
JP 2002025292 A 1/2002

* cited by examiner

*Primary Examiner* — Muna A Techane
(74) *Attorney, Agent, or Firm* — Venable LLP

(57) ABSTRACT

A semiconductor device is provided. The semiconductor device includes: a memory cell array including a plurality of memories arranged on a plurality of rows and a plurality of columns, each of the memories being a volatile memory; a plurality of repair circuits configured to repair the memory cell array; a selection circuit configured to select, from the plurality of repair circuits, a repair circuit to be connected to a memory included in the plurality of memories; and a holding circuit configured to hold selection information for selecting, by the selection circuit, a designated repair circuit out of the plurality of repair circuits, and control the selection circuit based on the selection information. The selection circuit is configured to be able to select at least two repair circuits in parallel out of the plurality of repair circuits.

11 Claims, 16 Drawing Sheets

SEMICONDUCTOR DEVICE AND APPARATUS

BACKGROUND OF THE INVENTION

Field of the Invention

The present invention relates to a semiconductor device and an apparatus.

Description of the Related Art

A semiconductor device equipped with a memory such as a volatile memory adopts a technique called redundancy repair for repairing a defective portion of a memory. Japanese Patent Laid-Open No. 2002-025292 discloses a technique of providing a redundant circuit including a preliminary memory in order to repair a defective bit included in a memory and improve the yield.

For example, when a preliminary memory has a defective portion or when a wiring pattern between a redundancy target memory and a preliminary memory has a trouble, the redundancy target memory may not be repaired.

SUMMARY OF THE INVENTION

According to some embodiments, a semiconductor device comprising: a memory cell array including a plurality of memories arranged on a plurality of rows and a plurality of columns, each of the memories being a volatile memory; a plurality of repair circuits configured to repair the memory cell array; a selection circuit configured to select, from the plurality of repair circuits, a repair circuit to be connected to a memory included in the plurality of memories; and a holding circuit configured to hold selection information for selecting, by the selection circuit, a designated repair circuit out of the plurality of repair circuits, and control the selection circuit based on the selection information, wherein the selection circuit is configured to be able to select at least two repair circuits in parallel out of the plurality of repair circuits, is provided.

Some embodiments of the present disclosure provide a technique advantageous for improving the redundancy repair effect.

Further features of the present invention will become apparent from the following description of exemplary embodiments (with reference to the attached drawings).

DESCRIPTION OF THE EMBODIMENTS

Figure 1:
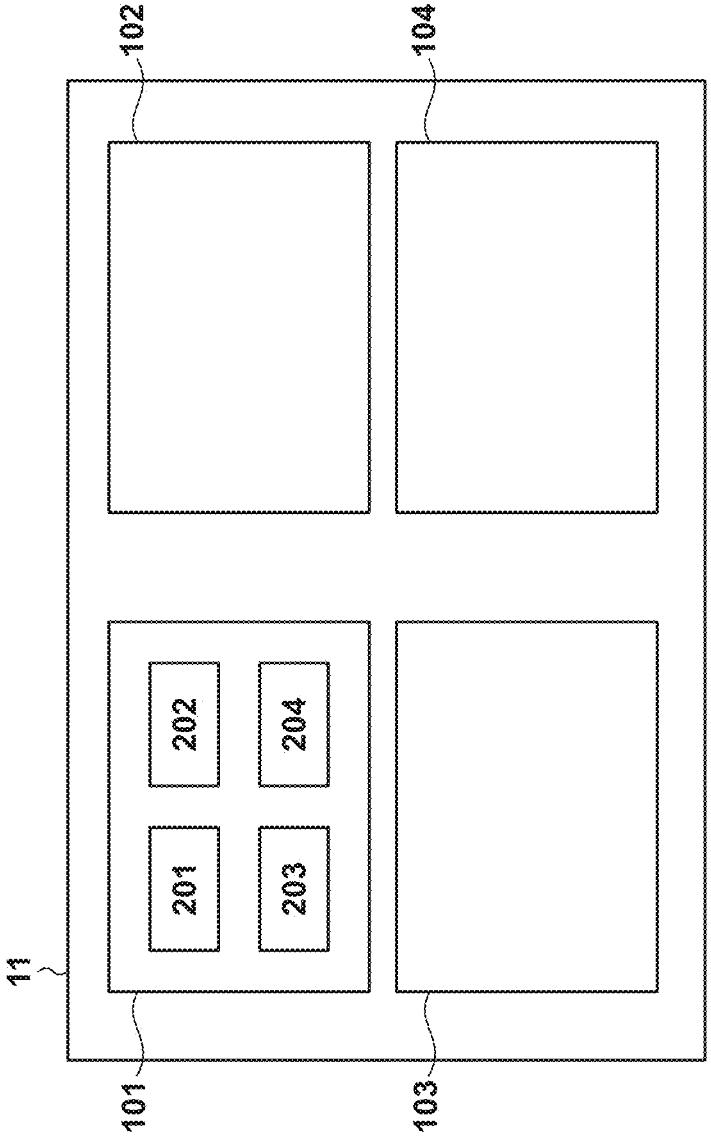
FIG. 1 is a block diagram showing an example of the configuration of a semiconductor device according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

A semiconductor device according to an embodiment of the present disclosure will be explained with reference to FIGS. 1 to 15. FIG. 1 is a block diagram showing an example of the configuration of a semiconductor device 11 according to the present disclosure. In the configuration shown in FIG. 1, four blocks 101 to 104 each including four memories 201 to 204 that are redundancy repair targets, in other words, are redundancy repairable are arranged in the semiconductor device 11. Each of the blocks 101 to 104 is a memory cell array including a plurality of memories arranged on a plurality of rows and a plurality of columns. Each memory arranged in each of the blocks 101 to 104 can be a volatile memory. The number of blocks arranged in the semiconductor device 11 is not limited to four and may be three or less or five or more. Similarly, the number of memories arranged in each block may be three or less or five or more. In FIG. 1, the memories 201 to 204 arranged in each of the blocks 102 to 104 are not illustrated.

Figure 2:
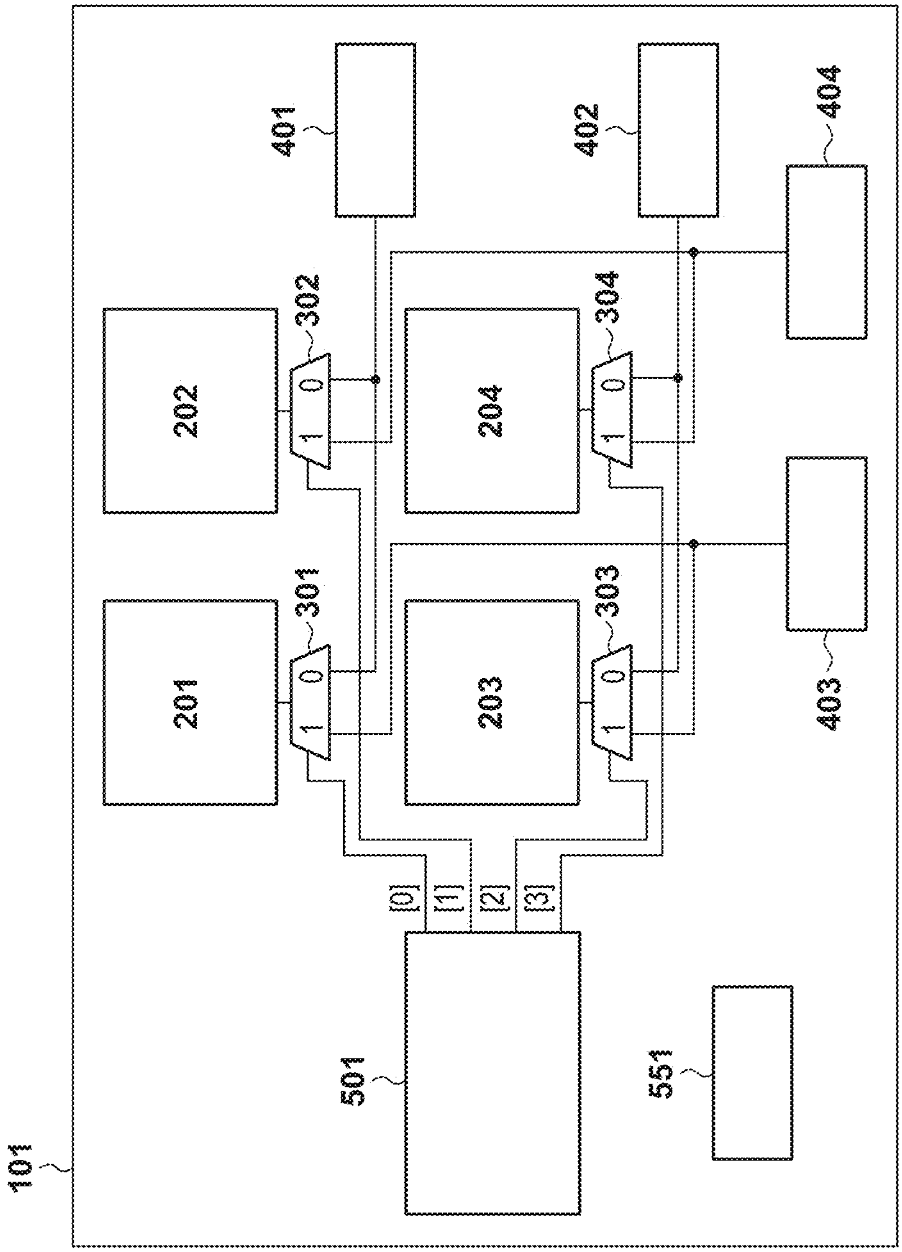
FIG. 2 is a circuit diagram showing an example of the configuration of memories arranged in the semiconductor device shown in FIG. 1, and circuits for repairing the memories.

FIG. 2 shows an example of the configuration of circuits when the four redundancy repairable memories 201 to 204 are arranged in the block 101. The memories 201 to 204 are, for example, volatile memories. Typically, each of the memories 201 to 204 is a static random access memory (SRAM). In addition to the memories 201 to 204, the block 101 of the semiconductor device 11 includes a plurality of repair circuits 401 to 404 for repairing memories (for example, the memories 201 to 204) arranged in the memory cell array, selection circuits 301 to 304, and a holding circuit 501. Each of the selection circuits 301 to 304 is arranged between a corresponding one of the memories 201 to 204 and two or more repair circuits out of the plurality of repair circuits 401 to 404. The selection circuits 301 to 304 select the repair circuits 401 to 404 connected to the memories 201 to 204 out of the plurality of repair circuits 401 to 404. The holding circuit 501 holds selection information for selecting, by the selection circuits 301 to 304, a designated repair circuit out of the plurality of repair circuits 401 to 404, and it controls the selection circuits 301 to 304 based on the selection information.

The repair circuits 401 to 404 may be nonvolatile memories or volatile memories. Examples of the nonvolatile memory are a read only memory (ROM), a flash memory, a magnetoresistive random access memory (MRAM), and a ferroelectric random access memory (FeRAM). Examples of the volatile memory are the above-mentioned SRAM, and a dynamic random access memory (DRAM). As shown in FIG. 2, the repair circuits 401 to 404 may be arranged for each row and each column with respect to the memories 201 to 204 aligned in the row and column directions. For example, the repair circuits 401 to 404 may not be arranged within the block 101 as long as they are arranged within the semiconductor device 11. For example, the repair circuits 401 to 404 may be nonvolatile memories that are arranged in the semiconductor device 11 and shared by two or more blocks out of the blocks 101 to 104. For example, the repair circuits 401 to 404 may be volatile memories such as flip-flops to which information to be repaired is transferred from the memories 201 to 204.

In the configuration shown in FIG. 2, the holding circuit 501 holds 4-bit information as selection information. A selection signal of the 0th bit of the holding circuit 501 is supplied to the selection circuit 301. Similarly, selection signals of the first, second, and third bits of the holding circuit 501 are supplied to the selection circuits 302, 303, and 304, respectively.

The selection circuit 301 is connected to a signal line to which a redundancy repair signal is output from the memory 201. Similarly, the selection circuits 302, 303, and 304 are connected to signal lines to which redundancy repair signals are output from the memories 202, 203, and 204.

The memory 201 is configured to be connectable via the selection circuit 301 to the repair circuits 401 and 403 out of the plurality of repair circuits 401 to 404. The memory 202 is configured to be connectable via the selection circuit 302 to the repair circuits 401 and 404 out of the plurality of repair circuits 401 to 404. The memory 203 is configured to be connectable via the selection circuit 303 to the repair circuits 402 and 403 out of the plurality of repair circuits 401 to 404. The memory 204 is configured to be connectable via the selection circuit 304 to the repair circuits 402 and 404 out of the plurality of repair circuits 401 to 404.

When the 0th bit of selection information held by the holding circuit 501 is "0", the repair circuit 401 is selected as a repair circuit to be connected to the memory 201 via the selection circuit 301, and when it is "1", the repair circuit 403 is selected. When the first bit of the selection information held by the holding circuit 501 is "0", the repair circuit 401 is selected as a repair circuit to be connected to the memory 202 via the selection circuit 302, and when it is "1", the repair circuit 404 is selected. When the second bit of the selection information held by the holding circuit 501 is "0", the repair circuit 402 is selected as a repair circuit to be connected to the memory 203 via the selection circuit 303, and when it is "1", the repair circuit 403 is selected. When the third bit of the selection information held by the holding circuit 501 is "0", the repair circuit 402 is selected as a repair circuit to be connected to the memory 204 via the selection circuit 304, and when it is "1", the repair circuit 404 is selected.

Figure 3A:
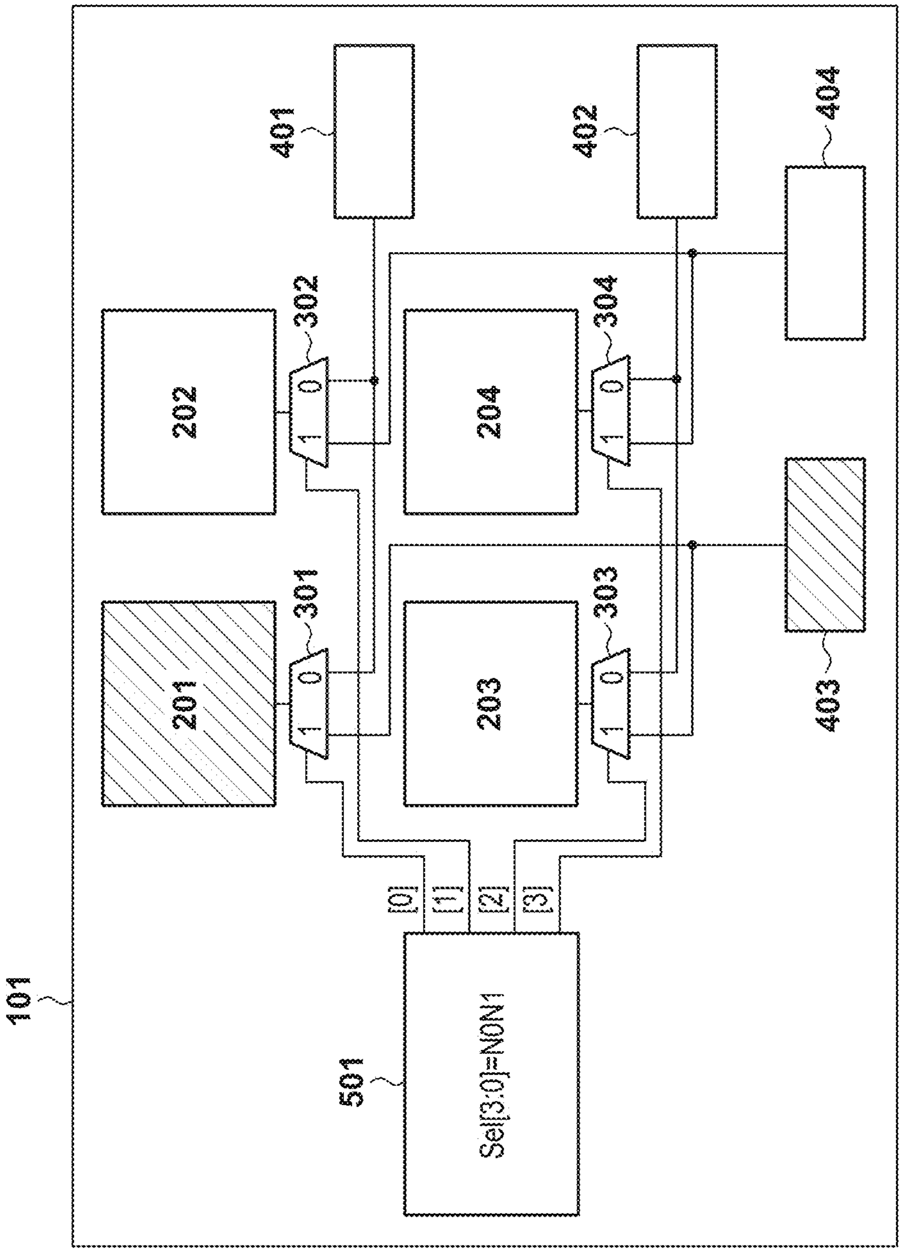
FIGS. 3A and 3B are circuit diagrams showing examples of switching of the circuits when repairing the memory shown in FIG. 2.
Figure 3B:
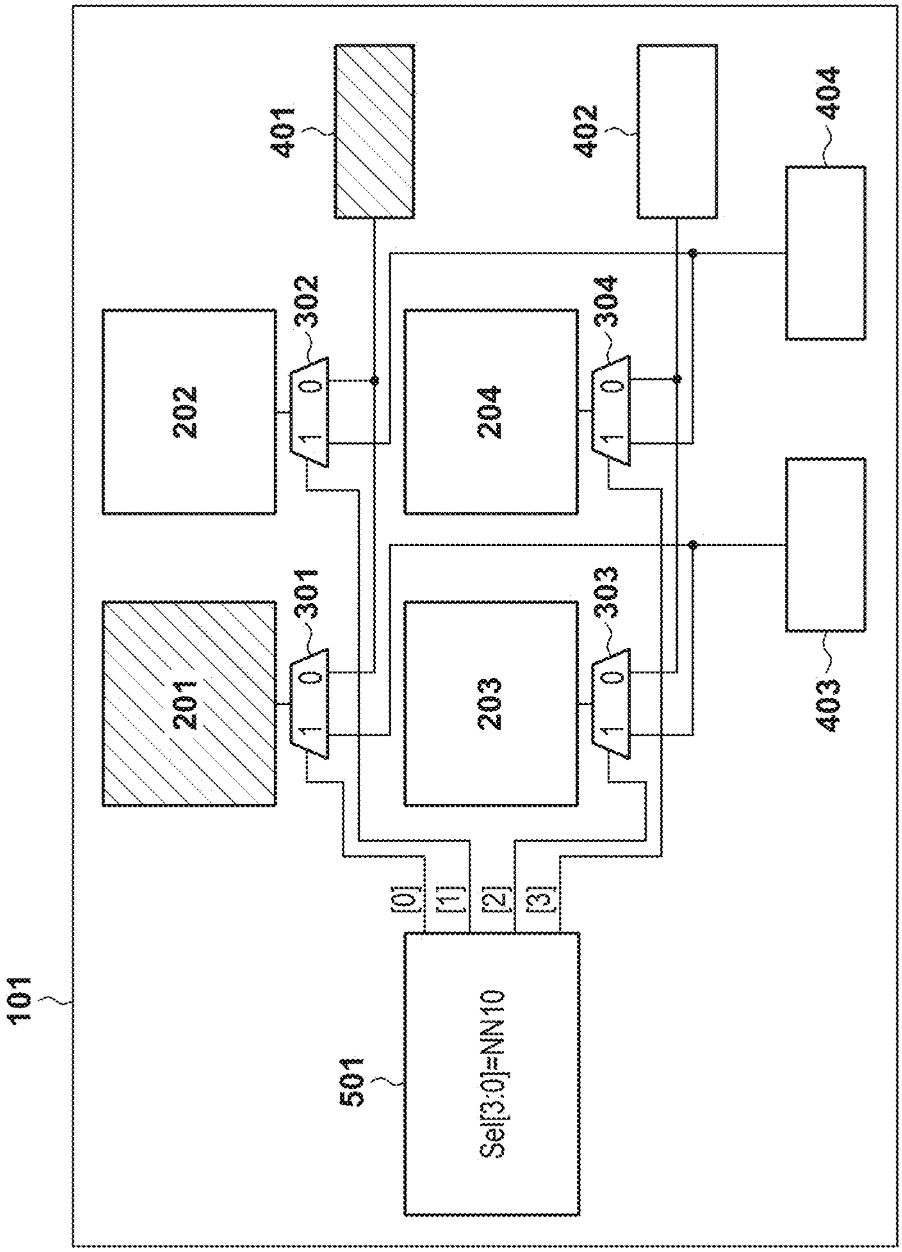

Next, examples of switching of the circuits when repairing the memory 201 will be described with reference to FIGS. 3A and 3B. When repairing the memory 201, there are two circuit configurations. In the example shown in FIG. 3A, the holding circuit 501 holds (N0N1) as 4-bit selection information Sel(3:0) (FIG. 3A shows Sel(3:0)=N0N1. This also applies hereinafter). Here, "N" is either a "0" or "1" selection signal. When the holding circuit 501 supplies "1" as a selection signal to the selection circuit 301, information to be repaired in the memory 201 is written in the repair circuit 403. In contrast, in the example shown in FIG. 3B, the holding circuit 501 holds (NN10) as the 4-bit selection information Sel(3:0). When the holding circuit 501 supplies "0" as a selection signal to the selection circuit 301, information to be repaired in the memory 201 is written in the repair circuit 401. In this manner, the memory 201 can be repaired regardless of which of the repair circuits 401 and 403 is used.

Figure 4:
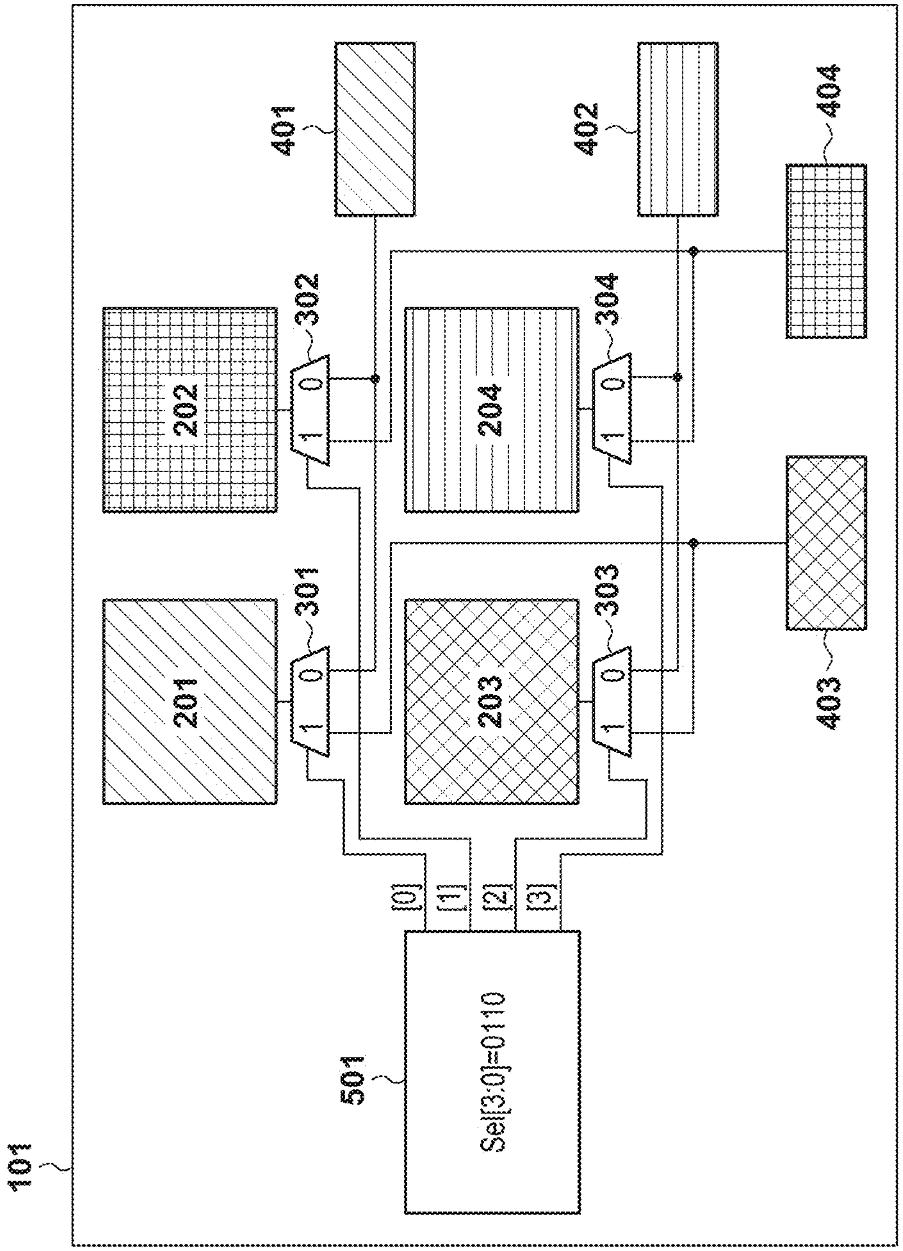
FIG. 4 is a circuit diagram showing an example of switching of the circuits when repairing the memories shown in FIG. 2.

FIG. 4 shows an example of switching of the circuits when repairing the memories 201 to 204. In this case, the holding circuit 501 holds (0110) as the 4-bit selection information Sel(3:0). Based on this, the memory 201 uses the repair circuit 401, the memory 202 uses the repair circuit 404, the memory 203 uses the repair circuit 403, and the memory 204 uses the repair circuit 402, thereby repairing all the memories 201 to 204. Although not shown, even when the holding circuit 501 holds (1001) as the selection information Sel(3:0), all the memories 201 to 204 are repaired using the corresponding repair circuits 401 to 404.

Figure 5:
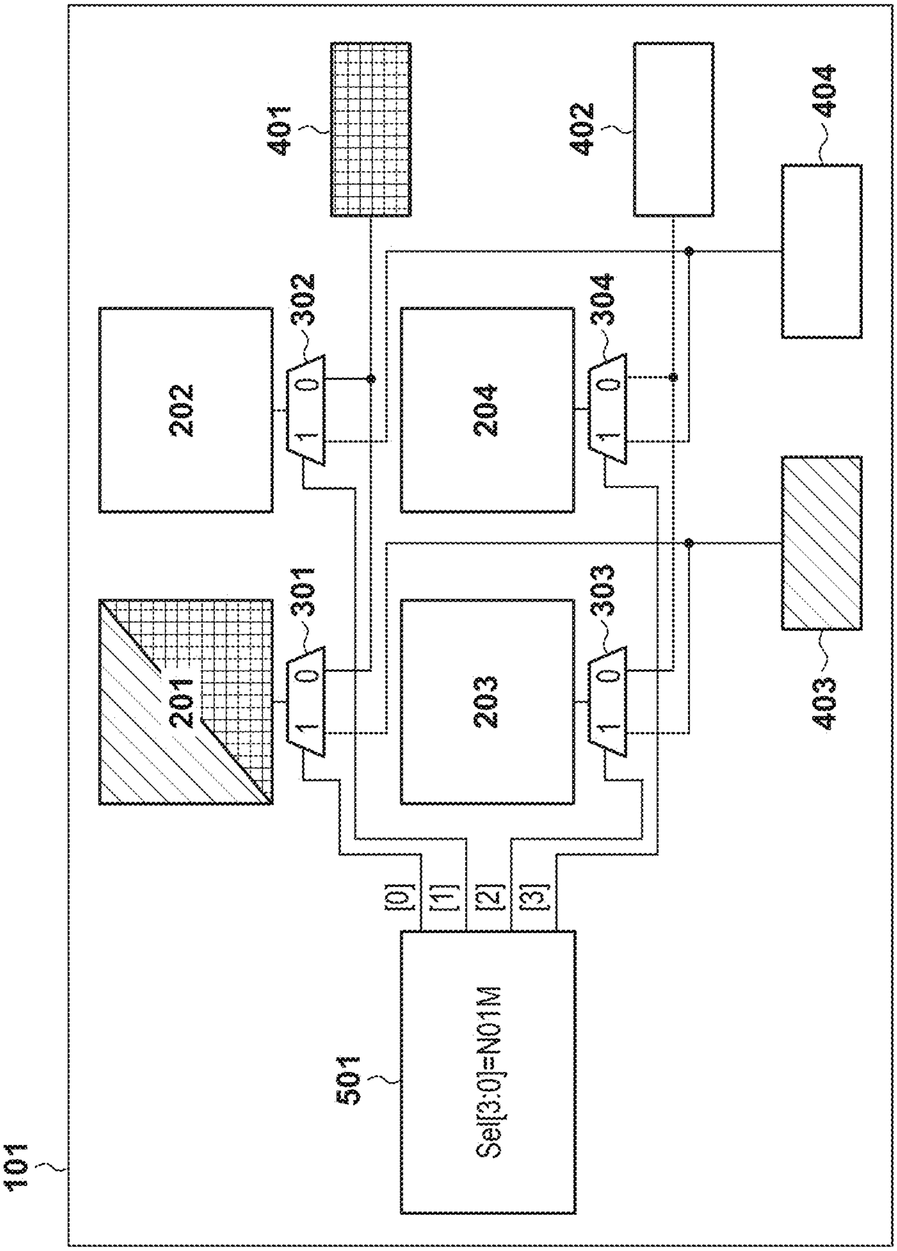
FIG. 5 is a circuit diagram showing an example of switching of the circuits when repairing the memory shown in FIG. 2.

FIG. 5 shows an example in which the repair circuits 401 and 403 can be used when repairing the memory 201. For example, when the repair circuit 401 is a nonvolatile memory, a trouble is generated in a memory area for repairing the memory 201, and a write error occurs, the redundancy target memory 201 may not be repaired. Also, for example, when a wiring pattern between the selection circuit 301 and the repair circuit 401 has a trouble, the memory 201 may not be repaired. An example of improving the redundancy in such a case will be explained with reference to FIG. 5.

As shown in FIG. 5, the holding circuit 501 holds (N01M) as the selection information Sel(3:0). That is, the "M" value of the 0th bit of the selection information Sel of the holding circuit 501 is so set that the selection circuit 301 can select the repair circuits 401 and 403. For example, even when a write error of the repair circuit 401 occurs and repair becomes impossible for M=0, the 0th bit of the selection information Sel is set to be M=1. Then, the repair circuit 403 can be used to repair the memory 201.

In the semiconductor device 11, not all the memories 201 to 204 arranged in the block 101 fail. Thus, as in a case shown in FIG. 5, either of the repair circuits 401 and 403 can be used as a preliminary repair circuit for the memory 201 that requires repair. In this case, information to be repaired in the memory 201 needs to be written in both the repair circuits 401 and 403.

As described above, in the circuit configuration according to this embodiment, the repair circuits 401 to 404 are arranged in correspondence with the respective memories 201 to 204. Thus, when a problem occurs in the memories 201 to 204, a high redundancy repair effect can be expected.

Further, a problem rarely occurs in all the memories 201 to 204. In such a case, a plurality of repair circuits are arranged for one memory. Even when a problem occurs in a repair circuit or when a problem occurs in a wiring pattern between a memory and a repair circuit, the faulty memory is highly likely to be repaired. This can further improve the redundancy repair effect.

Figure 6:
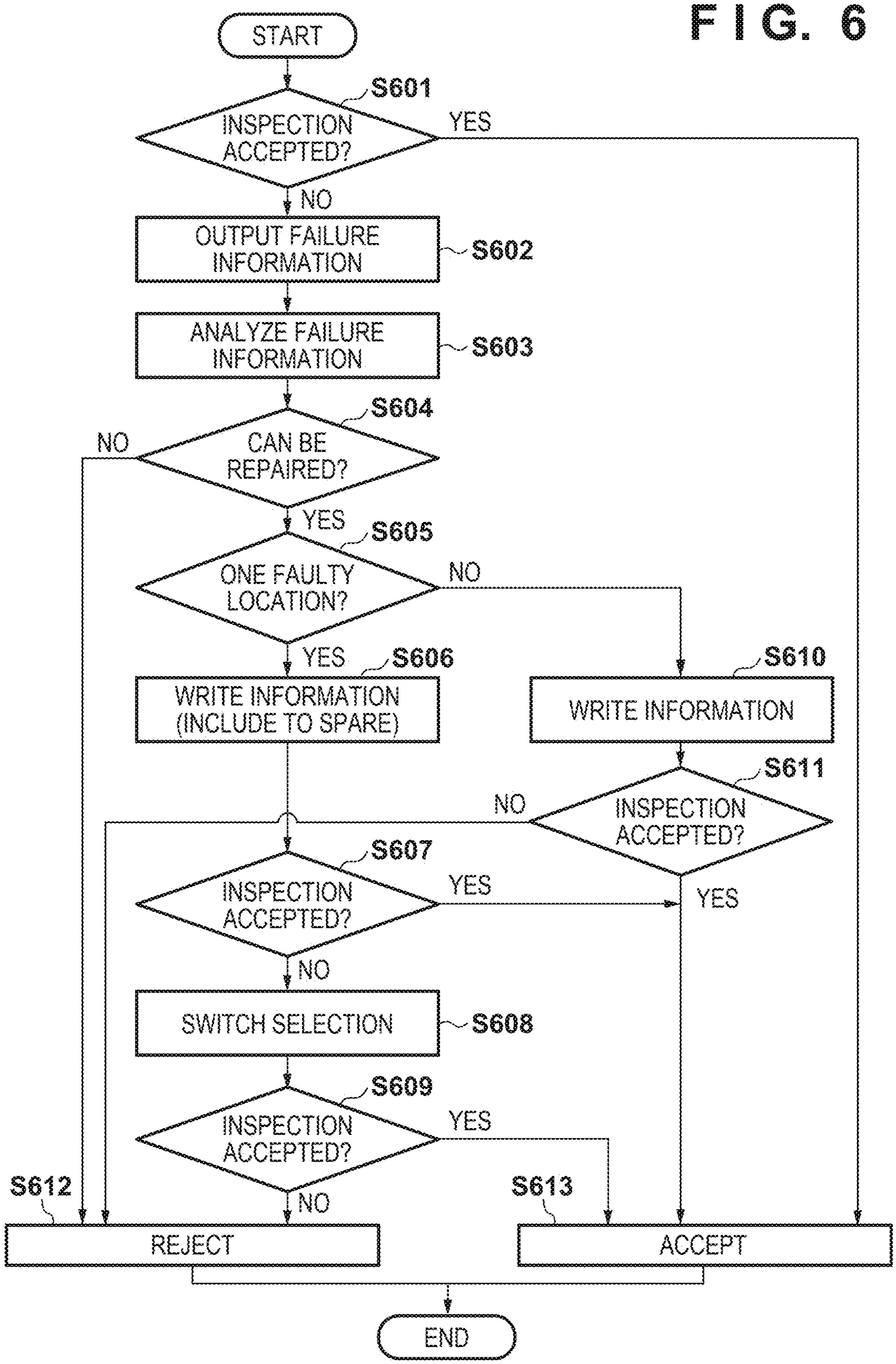
FIG. 6 is a flowchart showing an example of a sequence when repairing the memories shown in FIG. 2.

FIG. 6 shows an example of a sequence when repairing the memories 201 to 204. A sequence when repairing the memories 201 to 204 arranged in the block 101 will be explained below. A similar inspection can be performed even for other blocks (for example, the blocks 102 to 104). The sequence shown in FIG. 6 is a repair sequence when the repair circuits 401 to 404 are nonvolatile memories.

In step S601, the states of the memories 201 to 204 are inspected. The inspection of the memories 201 to 204 uses a technique such as built-in self-test (BIST). However, the inspection is not limited to this, and an appropriate technique capable of executing the inspection of the memories 201 to 204 can be used. An inspection circuit for inspecting the memories 201 to 204 may be arranged, for example, within the block 101, outside the block 101 and within the semiconductor device 11, or outside the semiconductor device 11.

If the inspection of the memories 201 to 204 is accepted in step S601, the memories 201 to 204 need not be repaired. Hence, it is determined that the block 101 is accepted (step S613), and the process ends. To the contrary, if the inspection of the memories 201 to 204 is rejected, failure information of the memories 201 to 204 is output to an analysis device arranged outside the semiconductor device 11 (step S602).

If the failure information is output from the semiconductor device 11, the analysis device outside the semiconductor device 11 analyzes the failure information representing the states of the memories 201 to 204 in step S603. The analysis device determines whether the memories 201 to 204 can be repaired (step S604). If it is determined that the memories 201 to 204 cannot be repaired, the block 101 is rejected (step S612), and the process ends.

If it is determined that the memories 201 to 204 can be repaired, the process shifts to step S605, and the analysis device determines whether the number of faulty memories is one. The faulty memory can include a partially faulty memory and a wholly faulty memory. If the number of faulty memories is one (for example, it will be explained that the faulty memory is the above-mentioned memory 201), the process shifts to step S606. In step S606, the analysis device generates selection information Sel(N01M) based on the states of the memories 201 to 204 and supplies it to the holding circuit 501. The holding circuit 501 controls the selection circuit 301 based on the selection information. The repair circuits 401 and 403 are connectable to the memory 201. Thus, the inspection circuit for inspecting the memories 201 to 204 writes the information in the memory 201 and the repair circuits 401 and 403 including a spare to which the memory 201 is connected. Then, in step S607, the state of the memory 201 and that of the repair circuit (for example, the repair circuit 401) connected to the memory 201 out of the plurality of repair circuits 401 to 404 are further inspected. If the inspection is accepted, it is determined that the block 101 is accepted (step S613), and the process ends.

If it is determined in step S607 that the inspection is rejected, the process shifts to step S608. In step S608, the 0th ("M") bit of the held information switches from "0" to "1", and the repair circuit connected to the memory 201 switches from the repair circuit 401 to the repair circuit 403. Then, in step S609, the state of the memory 201 and that of the repair circuit 403 connected to the memory 201 are further inspected. If the inspection is accepted, it is determined that the block 101 is accepted (step S613), and the process ends. If the inspection is rejected, it is determined that the block 101 is rejected (step S612), and the process ends.

If it is determined in step S605 that a plurality of memories out of the memories 201 to 204 fail, the process shifts to step S610. In step S610, the analysis device generates selection information Sel(0110) or (1001) based on the states of the memories 201 to 204 and supplies it to the holding circuit 501. The holding circuit 501 controls the selection circuit 301 based on the selection information. Then, the memories 201 to 204 are connected to the corresponding repair circuits 401 to 404, respectively. The inspection circuit for inspecting the memories 201 to 204 writes the information in the memories 201 to 204 and the repair circuits 401 to 404 respectively connected to the memories 201 to 204. In step S611, the states of the memories 201 to 204 and those of the repair circuits 401 to 404 respectively connected to the memories 201 to 204 are further inspected. If the inspection is accepted, it is determined that the block 101 is accepted (step S613), and the process ends. If the inspection is rejected, it is determined that the block 101 is rejected (step S612), and the process ends. Next, a repair sequence when the repair circuits 401 to 404 are volatile memories will be explained with reference to FIG. 7. First, in step S621, the states of the memories 201 to 204 are inspected. Step S621 can be similar to step S601 described above. If the inspection of the memories 201 to 204 is accepted in step S621, the memories 201 to 204 need not be repaired. It is therefore determined that the block 101 is accepted (step S628), and the process ends. In contrast, if the inspection of the memories 201 to 204 is rejected, failure information of the memories 201 to 204 is output to the analysis device arranged outside the semiconductor device 11 (step S622).

If the failure information is output from the semiconductor device 11, the analysis device outside the semiconductor device 11 analyzes in step S623 the failure information representing the states of the memories 201 to 204. The analysis device determines whether the memories 201 to 204 can be repaired (step S624). If it is determined that the memories 201 to 204 cannot be repaired, the block 101 is rejected (step S627), and the process ends.

If it is determined that the memories 201 to 204 can be repaired, the process shifts to step S625, and the analysis device generates selection information based on the states of the memories 201 to 204 and supplies it to the holding circuit 501. The holding circuit 501 controls the selection circuit 301 based on the selection information, and the memories 201 to 204 are connected to the designated repair circuits 401 to 404, respectively. The inspection circuit for inspecting the memories 201 to 204 writes the information in the memories 201 to 204 and the repair circuits 401 to 404 respectively connected to the memories 201 to 204.

Then, in step S626, the states of the memories 201 to 204 and those of the repair circuits 401 to 404 respectively connected to the memories 201 to 204 are further inspected. If the inspection is accepted, it is determined that the block 101 is accepted (step S628), and the process ends. If the inspection is rejected, the block 101 is rejected (step S627), and the process ends.

Figure 7:
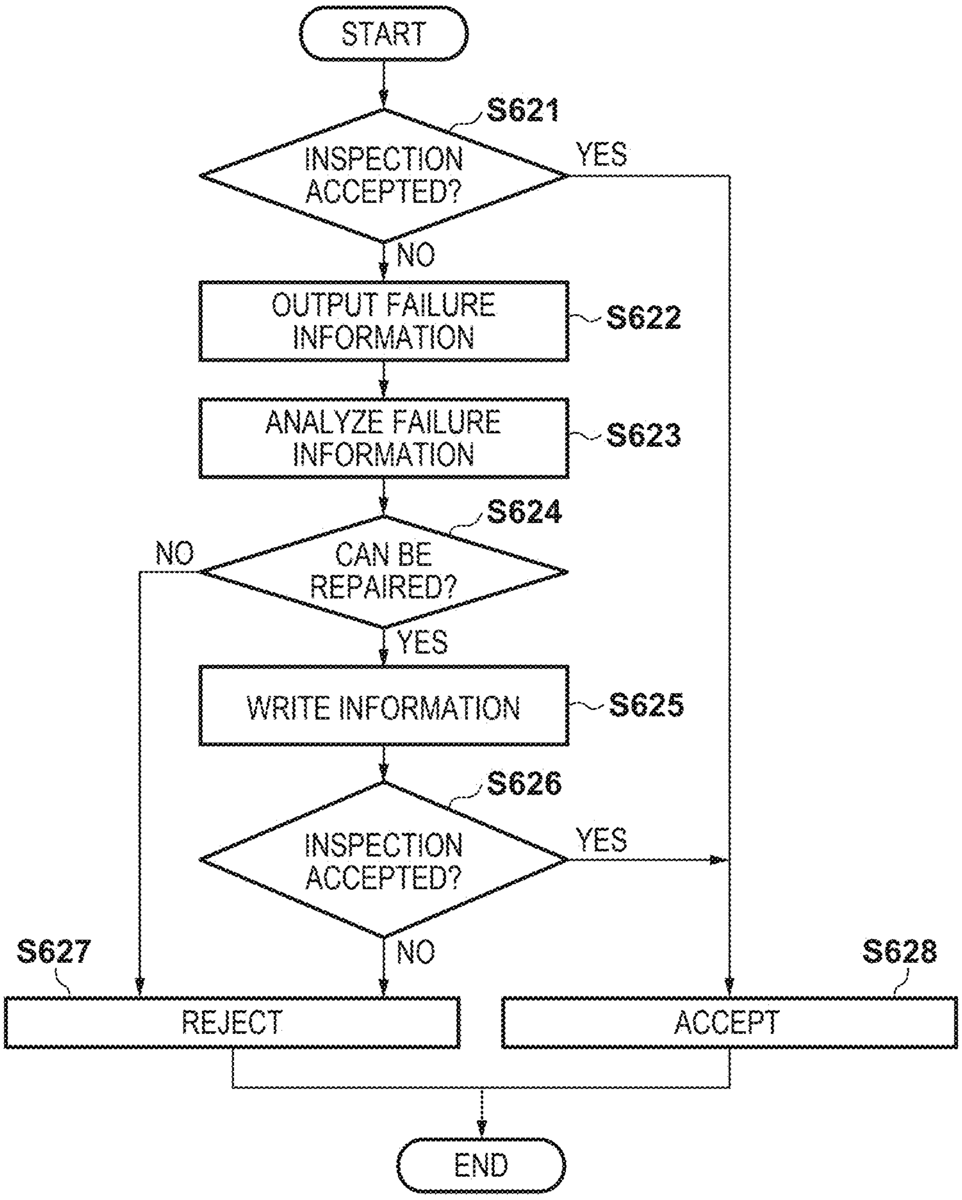
FIG. 7 is a flowchart showing an example of a sequence when repairing the memories shown in FIG. 2.
Figure 8:
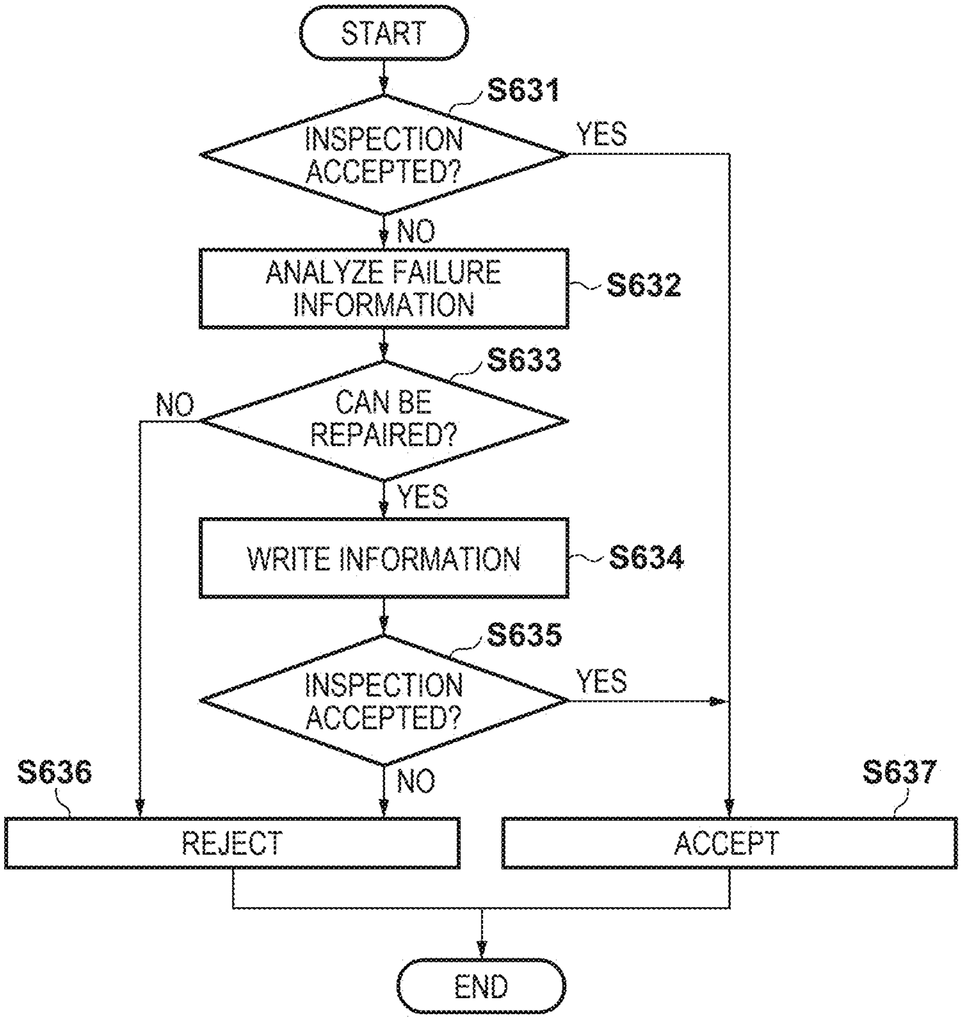
FIG. 8 is a flowchart showing an example of a sequence when repairing the memories shown in FIG. 2.

In the sequences shown in FIGS. 6 and 7, the analysis device arranged outside the semiconductor device 11 analyzes the states of the memories 201 to 204 and those of the repair circuits 401 to 404, and the analysis device supplies selection information to the holding circuit 501 based on the analysis result. However, the present invention is not limited to this. The analysis circuit for analyzing the states of the memories 201 to 204 and those of the repair circuits 401 to 404 may be arranged in the semiconductor device 11. For example, as shown in FIG. 2, an analysis circuit 551 may be arranged within the block 101. Alternatively, for example, the analysis circuit 551 may be arranged outside the block 101 and within the semiconductor device 11. In this case, the analysis circuit 551 may be shared between a plurality of blocks out of the blocks 101 to 104. FIG. 8 is a flowchart showing an example of a sequence when the analysis circuit 551 is arranged in the semiconductor device 11.

First, in step S631, the states of the memories 201 to 204 are inspected by the inspection circuit for inspecting the memories 201 to 204. Step S631 can be similar to steps S601 and S621 described above. If the inspection of the memories 201 to 204 is accepted in step S631, the memories 201 to 204 need not be repaired. Hence, it is determined that the block 101 is accepted (step S637), and the process ends.

In contrast, if the inspection of the memories 201 to 204 is rejected, failure information of the memories 201 to 204 is supplied to the analysis circuit 551 to perform analysis (step S632). Then, the analysis circuit 551 determines whether the memories 201 to 204 can be repaired (step S633). If it is determined that the memories 201 to 204 cannot be repaired, the block 101 is rejected (step S627), and the process ends.

If it is determined that the memories 201 to 204 can be repaired, the process shifts to step S634, and the analysis circuit 551 generates selection information based on the states of the memories 201 to 204 and supplies it to the holding circuit 501. The holding circuit 501 controls the selection circuit 301 based on the selection information supplied from the analysis circuit 551, and the memories 201 to 204 are connected to the designated repair circuits 401 to 404, respectively. The inspection circuit for inspecting the memories 201 to 204 writes the information in the memories 201 to 204 and the repair circuits 401 to 404 respectively connected to the memories 201 to 204.

In step S635, the states of the memories 201 to 204 and those of the repair circuits 401 to 404 respectively connected to the memories 201 to 204 are further inspected. If the inspection is accepted, it is determined that the block 101 is accepted (step S637), and the process ends. If the inspection is rejected, the block 101 is rejected (step S636), and the process ends.

Here, after generating selection information based on the states of the memories 201 to 204 in step S634, the analysis circuit 551 may further analyze the states of the memories 201 to 204 and those of the repair circuits 401 to 404 respectively connected to the memories 201 to 204. As described above, in some cases, only the memory 201 out of the plurality of memories 201 to 204 arranged in the block 101 fails. In such a case, the analysis circuit 551 generates selection information (N010) in step S634 and supplies it to the holding circuit 501. Then, if the inspection is rejected in step S635, the analysis circuit 551 generates selection information (N011) and supplies it to the holding circuit 501. That is, if selection information needs to be changed, the analysis circuit 551 may change the selection information in accordance with the state of the memory 201 and that of the repair circuit 401 connected to the memory 201 and supply the changed selection information to the holding circuit 501. In the above description, the inspection circuit for inspecting the memories 201 to 204 and the analysis circuit 551 are arranged independently. However, the inspection circuit and the analysis circuit 551 may be arranged at least partially integrally and operate in cooperation at least partially.

Figure 9A:
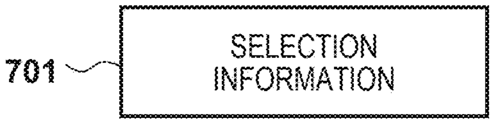
FIGS. 9A and 9B are views showing examples of setting information of a holding circuit shown in FIG. 2.
Figure 9B:

FIGS. 9A and 9B show information including selection information supplied to the holding circuit 501 when a predetermined address area of a nonvolatile memory serving as each of the repair circuits 401 to 404 is designated. The information can be, for example, information sent from outside the semiconductor device 11 to the semiconductor device 11.

FIG. 9A shows information 701 sent to the semiconductor device 11 when only one block (for example, the block 101) is arranged in the semiconductor device 11. In this case, it suffices to supply selection information (for example, the above-described 4-bit information) to only one holding circuit 501 arranged in the semiconductor device 11. The information 701 can be supplied to the semiconductor device 11 using an appropriate communication method such as serial communication or parallel communication.

FIG. 9B shows information 702 including selection information when the plurality of blocks 101 to 104 are arranged in the semiconductor device 11, as shown in FIG. 1. In this case, in addition to the selection information, the information 702 includes block information representing one of the blocks 101 to 104 including the holding circuit 501 to which selection information is supplied.

Figure 10A:
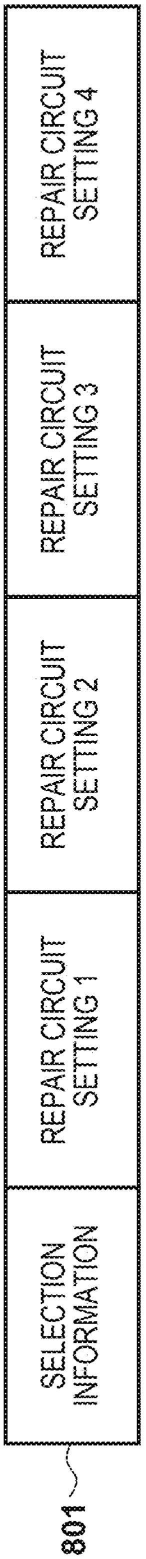
FIGS. 10A and 10B are views showing examples of the setting information of the holding circuit shown in FIG. 2.
Figure 10B:
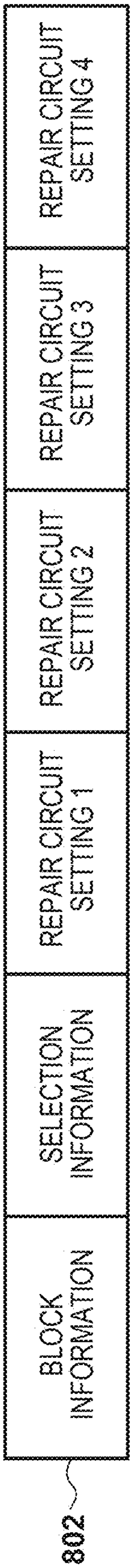

FIGS. 10A and 10B show information including selection information supplied to the holding circuit 501 when volatile memories are used as the repair circuits 401 to 404. The information can be, for example, information sent from outside the semiconductor device 11 to the semiconductor device 11.

FIG. 10A shows information 801 sent to the semiconductor device 11 when only one block (for example, the block 101) is arranged in the semiconductor device 11. In this case, setting information of the repair circuits 401 to 404 such as areas of the repair circuits 401 to 404 where repair information of the memories 201 to 204 is written is supplied to the semiconductor device 11, in addition to the information 701 shown in FIG. 9A. The information 801 can be supplied to the semiconductor device 11 using an appropriate communication method such as serial communication or parallel communication.

FIG. 10B shows information 802 including selection information when the plurality of blocks 101 to 104 are arranged in the semiconductor device 11, as shown in FIG. 1. In this case, the information 802 includes block information representing one of the blocks 101 to 104 including the holding circuit 501 to which selection information is supplied, similar to the relationship between the information 701 and the information 702.

When transferring position information of failure portions of the memories 201 to 204, the discrimination signals of the repair circuits 401 to 404, or the like in repairing the memories 201 to 204, the signal amount may increase. This may prolong the communication time. Also, a circuit used to decode a signal may become complicated, and the circuit design may become cumbersome. However, according to this embodiment, the information amount of the information 701, 702, 801, or 802 supplied to the semiconductor device 11 in repairing the memories 201 to 204 is small, as described above. For example, in the above-described configuration, the information 701 is only 4-bit information. This can shorten the communication time and minimize the circuit scale of the decoding circuit or the like. As a result, the user-friendly semiconductor device 11 can be implemented while ensuring high redundancy.

FIGS. 2 to 5 show the configuration in which each of the memories 201 to 204 is one-to-one connectable to any one of the repair circuits 401 to 404. However, when repair circuits are arranged by the same number as that of redundancy target memories, the circuit scale may become large. FIGS. 11 to 14 show examples of the configuration of circuits when a plurality of redundancy repair target memories are arranged for one repair circuit. In this case, the repair probability decreases, but the number of repair circuits can be decreased. It is quite unlikely that all redundancy target memories will fail. Hence, two or more redundancy repair target memories may be connected to one repair circuit in accordance with the circuit scale.

Figure 11:
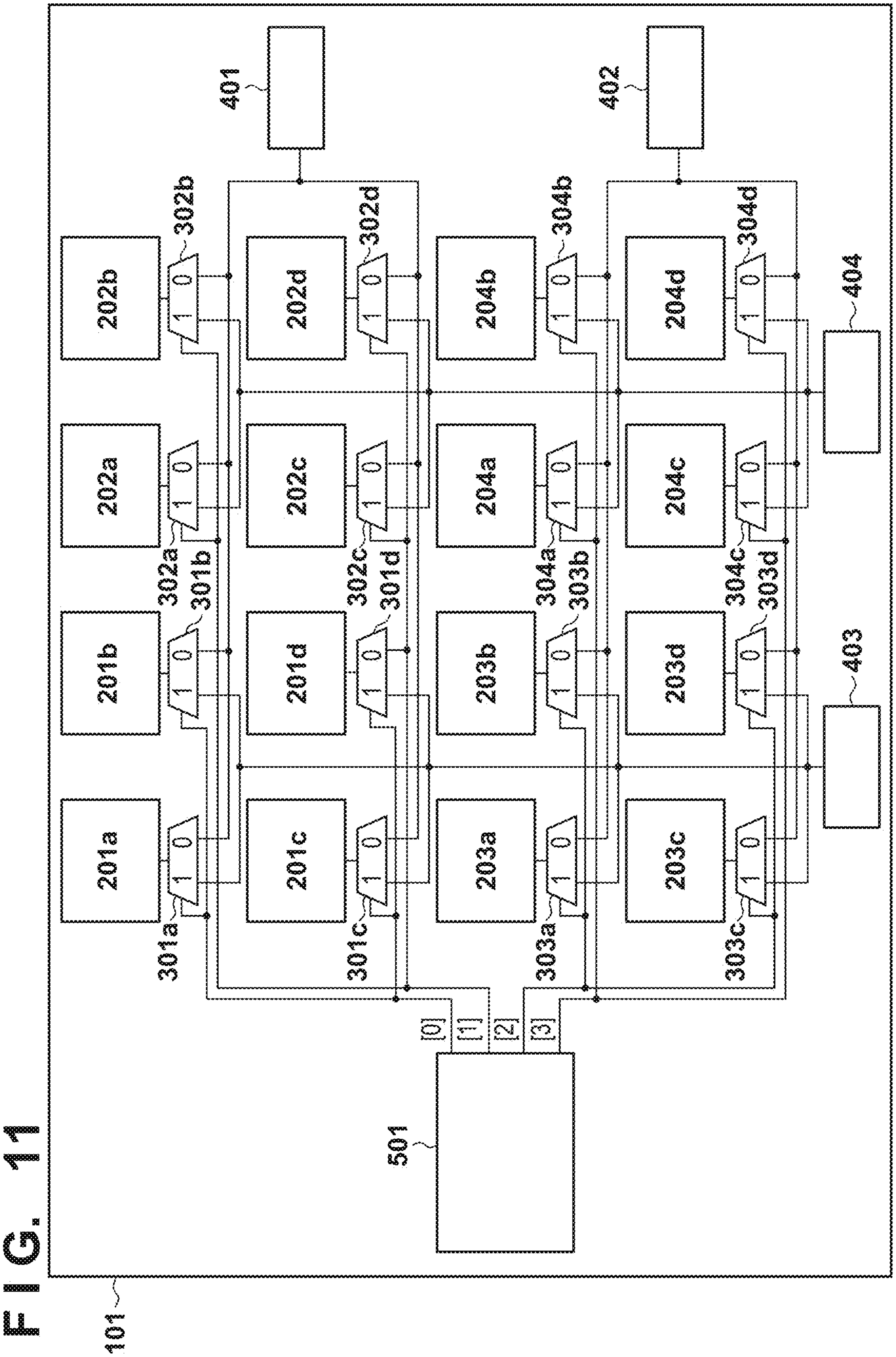
FIG. 11 is a circuit diagram showing an example of the configuration of memories arranged in the semiconductor device shown in FIG. 1, and circuits for repairing the memories.

FIG. 11 shows an example of the configuration of circuits in which 16 redundancy repairable memories 201*a* to 204*d* are arranged in the block 101. The plurality of repair circuits 401 to 404 for repairing the memories 201*a* to 204*d*, selection circuits 301*a* to 304*d*, and the holding circuit 501 are further arranged in the block 101 of the semiconductor device 11. An example in which the 16 memories 201*a* to 204*d* are arranged will be explained. However, the number of memories 201*a* to 201*d*, and that of selection circuits 301*a* to 304*d* arranged in correspondence with the memories 201*a* to 201*d* can be properly decided in accordance with specifications requested of the semiconductor device 11 and the like. Also, the number of arranged repair circuits, that of memories arranged to be connectable to one repair circuit, and the like can be properly decided in accordance with specifications requested of the semiconductor device 11 and the like. A difference from the above-described configuration will be explained, and a description of a configuration that can be similar will not be repeated.

The memories 201*a* to 201*d* are configured to be connectable via the corresponding selection circuits 301*a* to 301*d* to the repair circuits 401 and 403 out of the plurality of repair circuits 401 to 404. The memories 202*a* to 202*d* are configured to be connectable via the corresponding selection circuits 302*a* to 302*d* to the repair circuits 401 and 404 out of the plurality of repair circuits 401 to 404. The memories 203*a* to 203*d* are configured to be connectable via the corresponding selection circuits 303*a* to 303*d* to the repair circuits 402 and 403 out of the plurality of repair circuits 401 to 404. The memories 204*a* to 204*d* are configured to be connectable via the corresponding selection circuits 304*a* to 304*d* to the repair circuits 402 and 404 out of the plurality of repair circuits 401 to 404.

Similar to the above-described configuration, the holding circuit 501 holds 4-bit information as selection information. When the 0th bit of the selection information held by the holding circuit 501 is "0", the repair circuit 401 is selected as a repair circuit to be connected to the memories 201*a* to 201*d* via the selection circuits 301*a* to 301*d*, and when it is "1", the repair circuit 403 is selected. When the first bit of the selection information held by the holding circuit 501 is "0", the repair circuit 401 is selected as a repair circuit to be connected to the memories 202*a* to 202*d* via the selection circuits 302*a* to 302*d*, and when it is "1", the repair circuit 404 is selected. When the second bit of the selection information held by the holding circuit 501 is "0", the repair circuit 402 is selected as a repair circuit to be connected to the memories 203*a* to 203*d* via the selection circuits 303*a* to 303*d*, and when it is "1", the repair circuit 403 is selected. When the third bit of the selection information held by the holding circuit 501 is "0", the repair circuit 402 is selected as a repair circuit to be connected to the memories 204*a* to 204*d* via the selection circuits 304*a* to 304*d*, and when it is "1", the repair circuit 404 is selected. In this manner, the repair circuit 401 is connected to, for example, the plurality of memories 201*a* to 201*d*. This also applies to the repair circuits 402 to 404. Even when the repair circuits 401 to 404 are shared between a plurality of redundancy target memories, a problem rarely occurs though it depends on the failure rate of the memories 201*a* to 204*d*.

Figure 12:
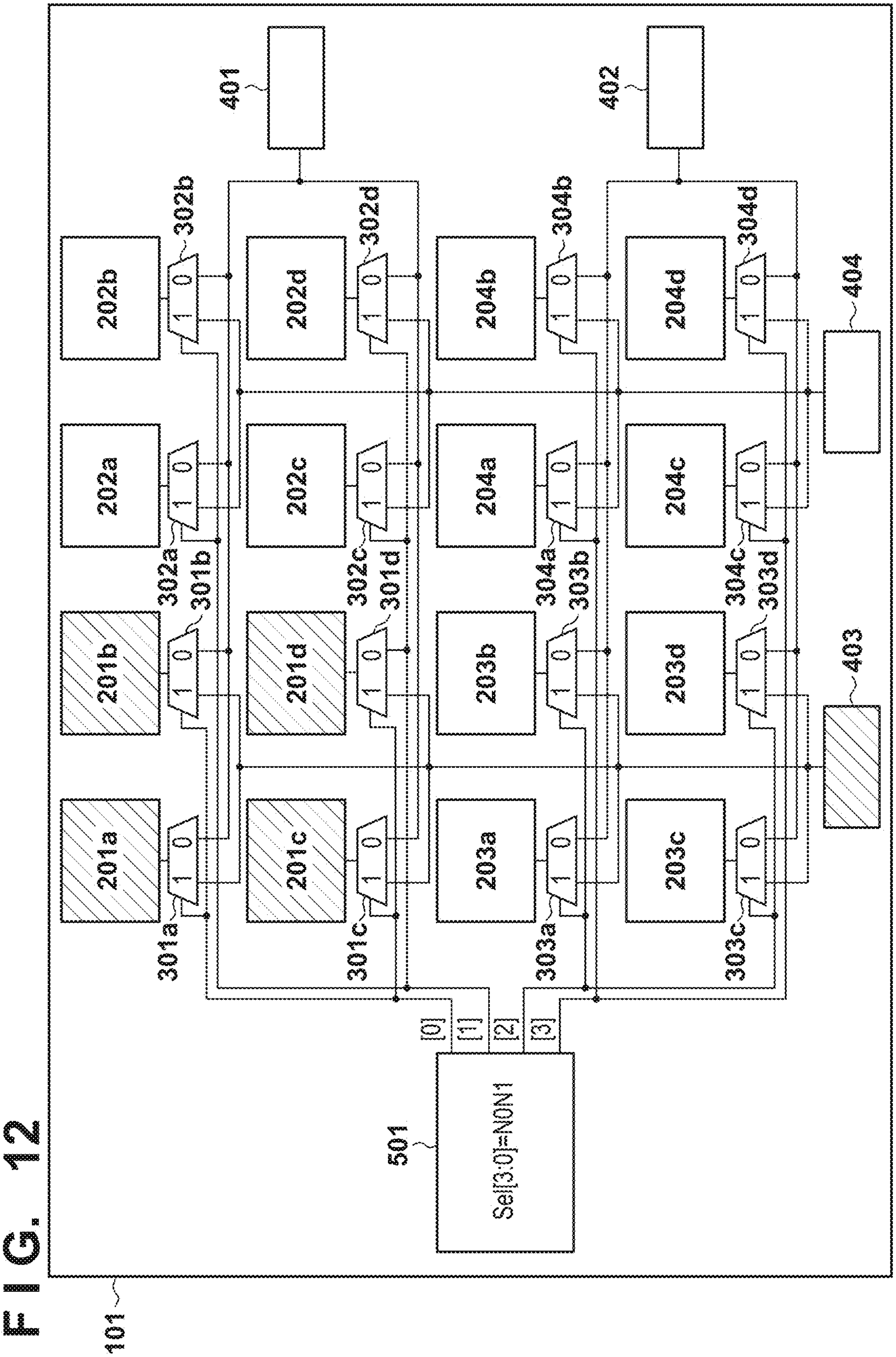
FIG. 12 is a circuit diagram showing an example of switching of the circuits when repairing the memory shown in FIG. 11.

FIG. 12 shows an example of switching of the circuits when repairing the faulty memory 201*a*. As shown in FIG. 12, the holding circuit 501 holds (N0N1) as the 4-bit selection information Sel(3:0). When the holding circuit 501 supplies "1" as a selection signal to the selection circuit 301*a*, information to be repaired in the memory 201*a* is written in the repair circuit 403. In this case, the selection circuits 301*b* to 301*d* are controlled to select the same repair circuit 403 as that of the selection circuit 301*a* out of the plurality of repair circuits 401 to 404. In this case, the repair circuit 403 is used by the respective memories 201*a* to 201*d*. However, the repair circuit 403 can be designed such that no problem occurs even when, for example, the normal memories 201*b* to 201*d* use the repair circuit 403. This also applies to the remaining repair circuits 401, 402, and 404. Also, for example, each of the memories 201*a* to 204*d* may have a function of selecting whether to use the repair circuits 401 to 404. Further, for example, information for selecting whether to use the repair circuits 401 to 404, other than selection information, may be supplied together with the selection information.

Figure 13:
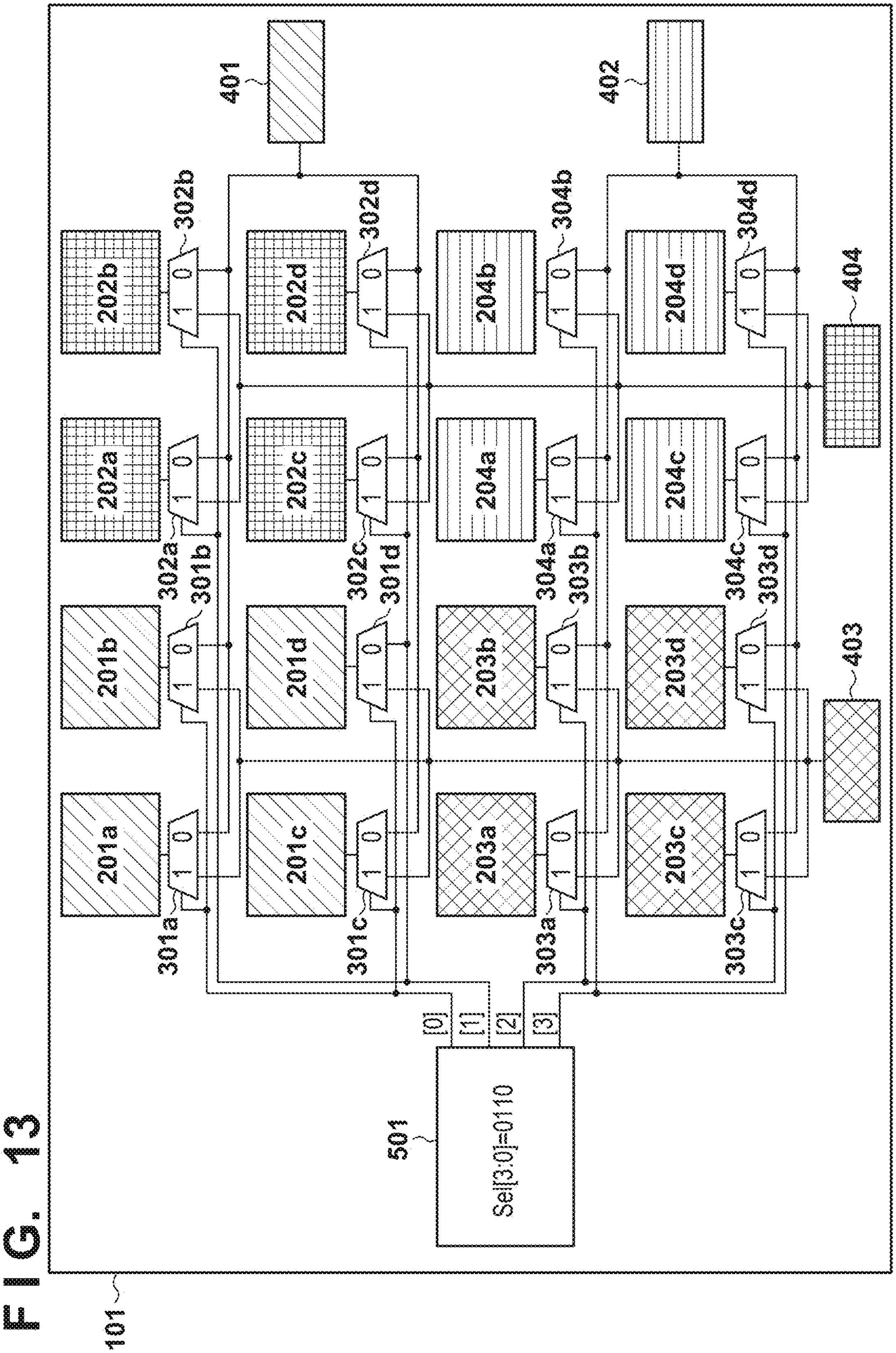
FIG. 13 is a circuit diagram showing an example of switching of the circuits when repairing the memories shown in FIG. 11.

FIG. 13 shows an example of switching of the circuits when repairing any of the memories 201*a* to 201*d*, any of the memories 202*a* to 202*d*, any of the memories 203*a* to 203*d*, and any of the memories 204*a* to 204*d*. In this case, the holding circuit 501 holds (0110) as the 4-bit selection information Sel(3:0). Based on this, the memories 201*a* to 201*d* use the repair circuit 401, the memories 202*a* to 202*d* use the repair circuit 404, the memories 203*a* to 203*d* use the repair circuit 403, and the memories 204*a* to 204*d* use the repair circuit 402 so that all the memories 201*a* to 204*d* can be repaired. Although not shown, even when the holding circuit 501 holds (1001) as the selection information Sel(3:0), all the memories 201*a* to 204*d* can be repaired using the corresponding repair circuits 401 to 404.

As described with reference to FIG. 12, the repair circuits 401 to 404 can be designed such that no problem occurs even when, for example, normal memories out of the memories 201*a* to 204*d* use the repair circuits 401 to 404, respectively. Also, for example, each of the memories 201*a* to 204*d* may have a function of selecting whether to use the repair circuits 401 to 404. Further, for example, information for selecting whether to use the repair circuits 401 to 404, other than selection information, may be supplied together with the selection information.

Figure 14:
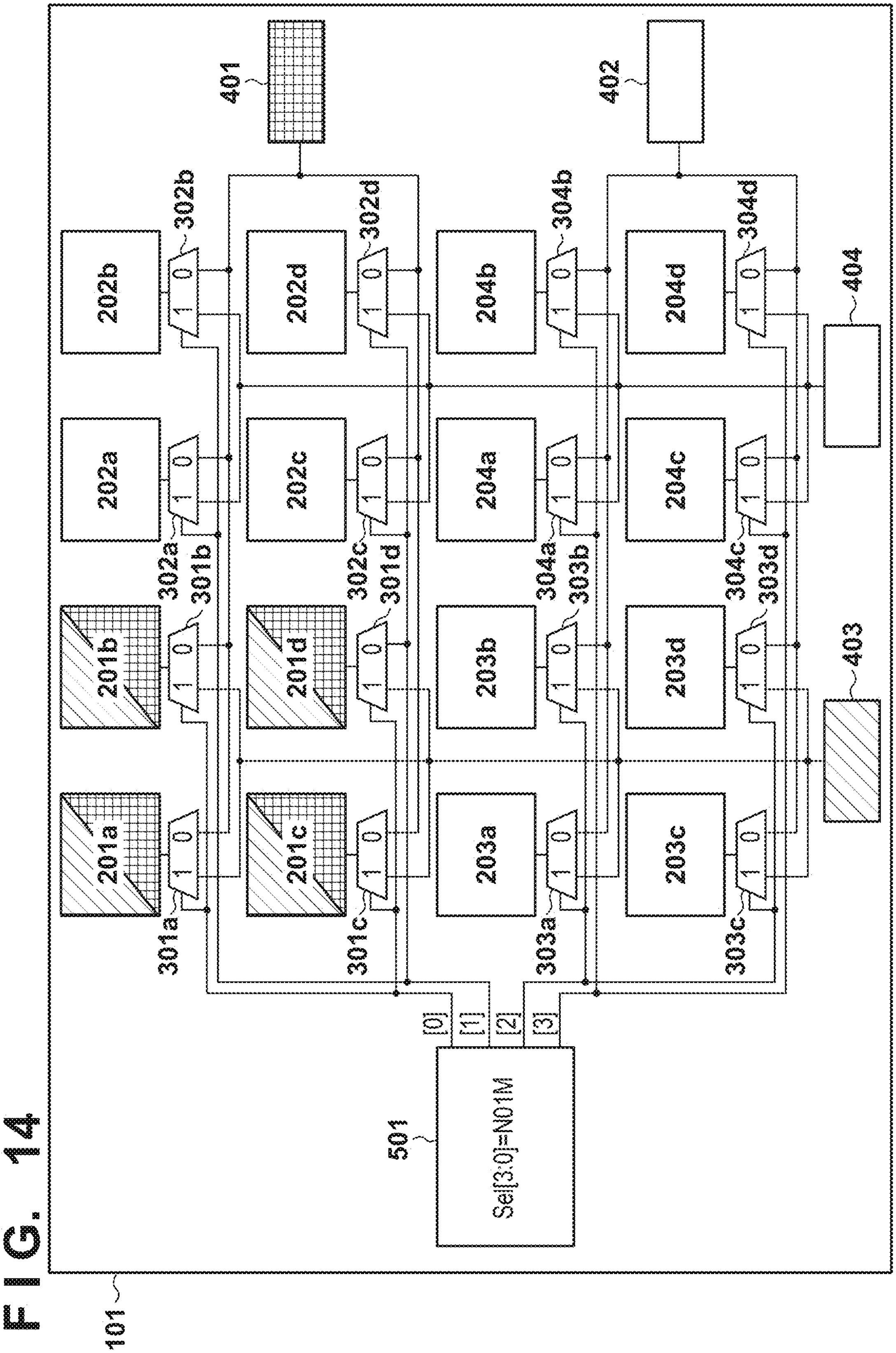
FIG. 14 is a circuit diagram showing an example of switching of the circuits when repairing the memory shown in FIG. 11.

FIG. 14 shows an example in which the plurality of repair circuits 401 and 403 can be used when repairing the memory 201*a*. For example, when the repair circuit 401 is a nonvolatile memory, a problem is generated in a memory area for repairing the memory 201*a*, and a write error occurs, the redundancy target memory 201*a* may not be repaired. Also, for example, when a wiring pattern between the selection circuit 301*a* and the repair circuit 401 has a problem, the memory 201*a* may not be repaired. An example of improving the redundancy in such a case will be explained with reference to FIG. 14.

As shown in FIG. 14, the holding circuit 501 holds (N01M) as the selection information Sel(3:0). That is, the "M" value of the 0th bit of the selection information Sel of the holding circuit 501 is so set that the selection circuit 301*a* can select the repair circuits 401 and 403. For example, even when a write error of the repair circuit 401 occurs and repair becomes impossible for M=0, the 0th bit of the selection information Sel is set to be M=1. Then, the repair circuit 403 can be used to repair the memory 201*a*.

Even in the circuit configuration shown in FIGS. 11 to 14, the memories 201*a* to 204*d* are repaired in accordance with the above-described sequences shown in FIGS. 6 to 8. As for the pieces of information 701, 702, 801, and 802 supplied from outside the semiconductor device 11 to the semiconductor device 11, similar information is supplied. Even in the configuration shown in FIGS. 11 to 14, while improving the redundancy repair effect, the number of repair circuits that may not be used when no failure is generated in the memories 201*a* to 204*d* can be suppressed.

Figure 15:
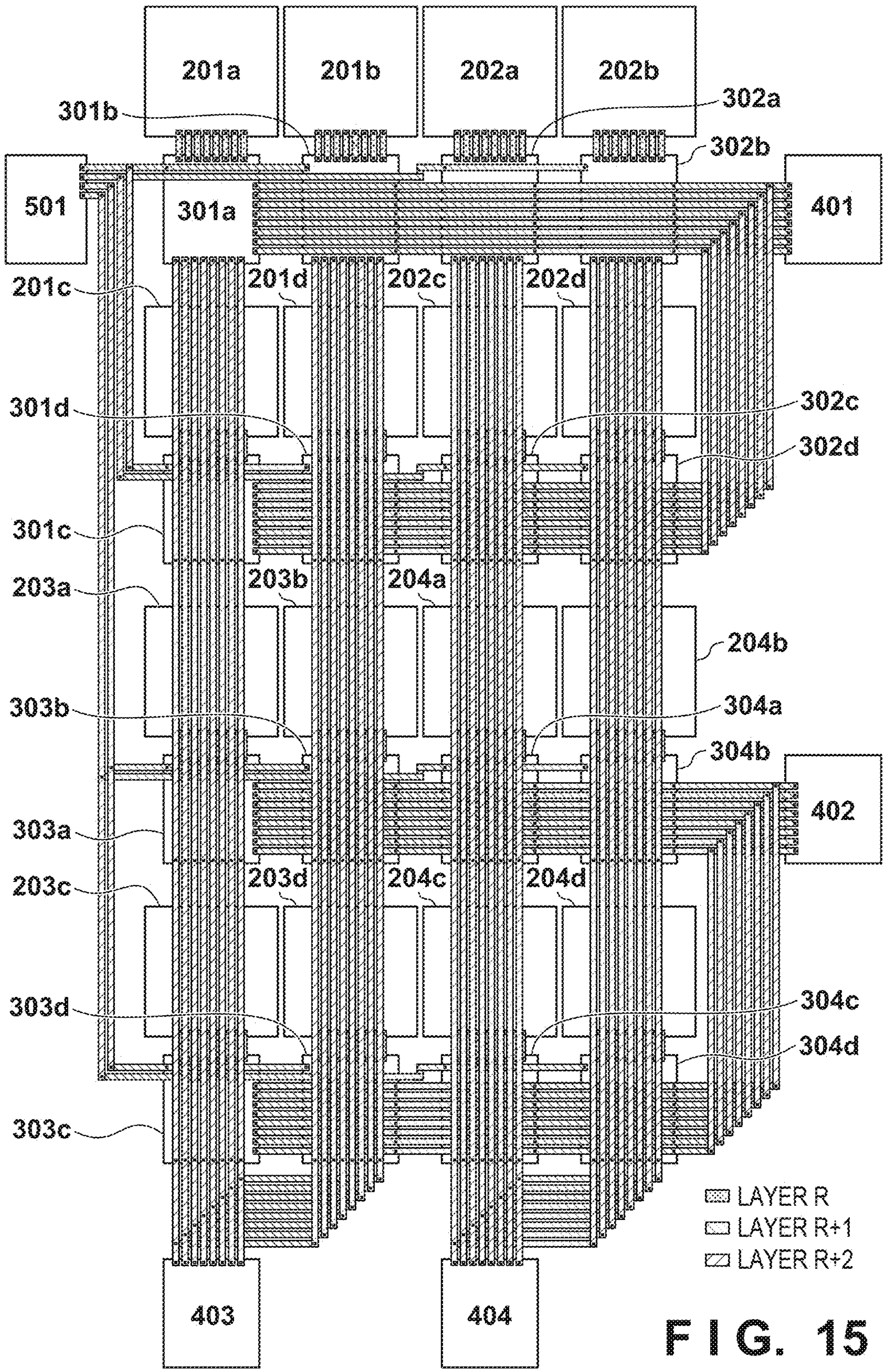
FIG. 15 is a diagram showing an example of the layout of the circuits shown in FIG. 11.

FIG. 15 shows a layout example in the circuit configuration shown in FIG. 11. As shown in FIG. 15, only one wiring pattern is arranged from the holding circuit 501 for each of the selection circuits 301*a* to 304*d* respectively connected to the memories 201*a* to 204*d* because supply of a 1-bit selection signal is sufficient. Further, lines can be integrated for every four selection circuits to supply a signal. This improves the wiring efficiency. Eight wiring patterns are arranged as common wiring patterns from the repair circuit 401 to the selection circuits 301*a*, 301*b*, 302*a*, and 302*b*. Hence, the number of wiring lines becomes ¼ in comparison with a case where wiring lines are arranged from the repair circuit 401 separately to the respective selection circuits 301*a*, 301*b*, 302*a*, and 302*b*. This also applies to other combinations of the repair circuits and the selection circuits.

As described above, each of the redundancy repair target memories 201 to 204 is configured to be connectable via a corresponding one of the selection circuits 301 to 304 to two or more repair circuits out of the repair circuits 401 to 404. In contrast, the selection circuits 301 to 304 are controlled by one holding circuit 501 based on selection information. This can reduce wiring patterns between the holding circuit 501 and the selection circuits 301*a* to 304*d* and wiring patterns between the selection circuits 301*a* to 304*d* and the corresponding repair circuits 401 to 404. That is, the complication of wiring patterns in the block 101 can be reduced to facilitate the layout design of the block 101. The reduction of wiring patterns can decrease the possibility of generation of a problem such as disconnection of a wiring pattern and can implement improvement of the yield of the semiconductor device 11 and the like.

Figure 16:
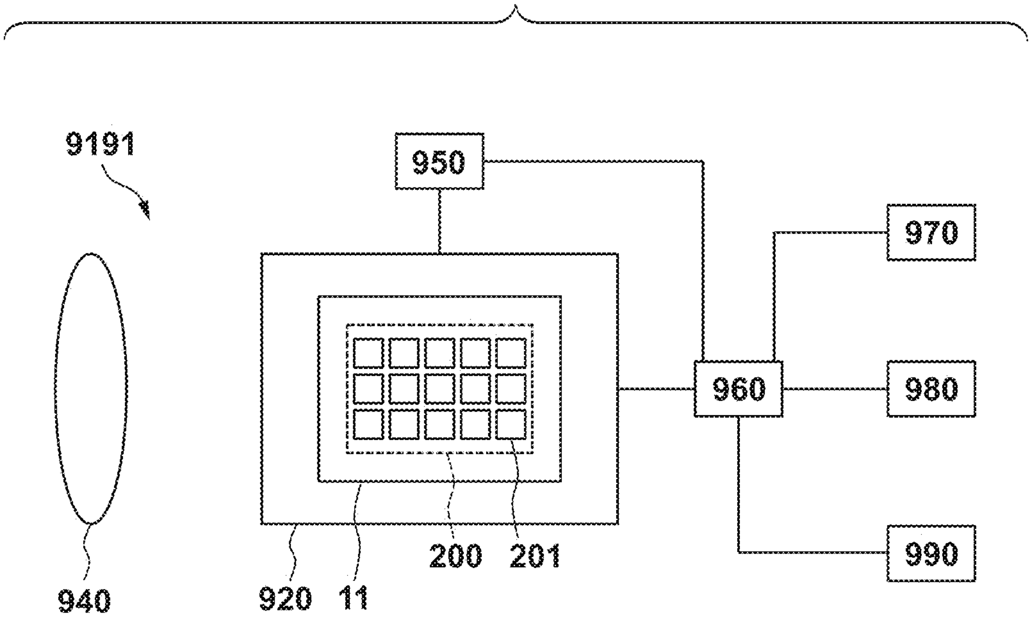
FIG. 16 is a schematic view showing an example of the configuration of an apparatus including the semiconductor device in FIG. 1.

Here, with reference to FIG. 16, an application example of the semiconductor device 11 according to this embodiment will be described. FIG. 16 is a schematic view of an apparatus 9191 including the semiconductor device 11. Here, it will be described that the semiconductor device 11 includes a pixel region 200 with a pixel 201 arranged therein. Further, a case will be described in which a photoelectric conversion element is arranged in each pixel 201. That is, the semiconductor device 11 is a so-called photoelectric conversion device. In this case, the semiconductor device 11 can also be called an image capturing device. In the apparatus 9191, the semiconductor device 11 is accommodated in a package 920. The apparatus 9191 can include at least one of an optical device 940, a control device 950, a processing device 960, a display device 970, a storage device 980, and a mechanical device 990. However, the semiconductor device 11 arranged in the apparatus 9191 is not limited to the photoelectric conversion device, and may function as a light emitting device, a processing device, a storage device, or the like as long as the semiconductor device 11 includes a redundancy repair target memory as described above. The apparatus 9191 only needs to include, for example, the semiconductor device 11, and a processing device that processes a signal output from the semiconductor device 11.

The apparatus 9191 including the semiconductor device 11 functioning as a photoelectric conversion device shown in FIG. 16 will be described below in detail. The package 920 can include a base on which the semiconductor device 11 is fixed, and a cover made of glass or the like facing the semiconductor device 11. The package 920 can further include a joining member such as a bonding wire and bump for connecting a terminal of the base and the pad of the semiconductor device 11.

The apparatus 9191 can include at least one of the optical device 940, the control device 950, the processing device 960, the display device 970, the storage device 980, and the mechanical device 990. The optical device 940 is implemented by, for example, a lens, a shutter, and a mirror. The control device 950 controls the semiconductor device 11. The control device 950 is, for example, a semiconductor device such as an ASIC.

The processing device 960 processes a signal output from the semiconductor device 11. The processing device 960 is a semiconductor device such as a CPU or an ASIC for forming an analog front end (AFE) or a digital front end (DFE). The display device 970 is an EL display device or a liquid crystal display device that displays information (image) obtained by the semiconductor device 11 functioning as a photoelectric conversion device. The storage device 980 is a magnetic device or a semiconductor device that stores the information (image) obtained by the semiconductor device 11. The storage device 980 is a volatile memory such as an SRAM or a DRAM, or a nonvolatile memory such as a flash memory or a hard disk drive.

The mechanical device 990 includes a moving or propulsion unit such as a motor or an engine. In the apparatus 9191, the signal output from the semiconductor device 11 is displayed on the display device 970 or transmitted to an external device by a communication device (not shown) included in the apparatus 9191. Hence, the apparatus 9191 may further include the storage device 980 and the processing device 960 in addition to the memory circuits and arithmetic circuits included in the semiconductor device 11. The mechanical device 990 may be controlled based on the signal output from the semiconductor device 11.

In addition, the apparatus 9191 is suitable for an electronic apparatus such as an information terminal (for example, a smartphone or a wearable terminal) which has an image capturing function or a camera (for example, an interchangeable lens camera, a compact camera, a video camera, or a monitoring camera). The mechanical device 990 in the camera can drive the components of the optical device 940 in order to perform zooming, an in-focus operation, and a shutter operation. Alternatively, the mechanical device 990 in the camera can move the semiconductor device 11 in order to perform an anti-vibration operation.

Furthermore, the apparatus 9191 can be a transportation apparatus such as a vehicle, a ship, or an airplane. The mechanical device 990 in the transportation apparatus can be used as a moving device. The apparatus 9191 as the transportation apparatus is suitable for a device that transports the semiconductor device 11 or a device that uses an image capturing function to assist and/or automate driving (steering). The processing device 960 for assisting and/or automating driving (steering) can perform, based on the information obtained by the semiconductor device 11, processing for operating the mechanical device 990 as a moving device.

Alternatively, the apparatus 9191 may be a medical apparatus such as an endoscope, measurement apparatus such as a distance measurement sensor, an analysis device such as an electron microscope, or an office apparatus such as a copy machine.

According to some embodiments of the present disclosure, a technique advantageous for improving the redundancy repair effect can be provided.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2024-002047, filed Jan. 10, 2024, which is hereby incorporated by reference herein in its entirety.

What is claimed is:

1. A semiconductor device comprising:

a memory cell array including a plurality of memories arranged on a plurality of rows and a plurality of columns, each of the memories being a volatile memory;

a plurality of repair circuits configured to repair the memory cell array;

a selection circuit configured to select, from the plurality of repair circuits, a repair circuit to be connected to a memory included in the plurality of memories; and a holding circuit configured to hold selection information for selecting, by the selection circuit, a designated repair circuit out of the plurality of repair circuits, and control the selection circuit based on the selection information, wherein the selection circuit is configured to be able to select at least two repair circuits in parallel out of the plurality of repair circuits.

2. The device according to claim 1, wherein the holding circuit is configured to control the selection circuit based on the selection information supplied from outside the semiconductor device.

3. The device according to claim 1, further comprising an analysis circuit configured to analyze a state of the memory, wherein the analysis circuit is configured to generate the selection information based on the state of the memory and supply the selection information to the holding circuit.

4. The device according to claim 3, wherein after generating the selection information based on the state of the memory, the analysis circuit is configured to further analyze the state of the memory and a state of a repair circuit connected to the memory out of the plurality of repair circuits.

5. The device according to claim 4, wherein in a case where the selection information needs to be changed in accordance with the state of the memory and the state of the repair circuit connected to the memory out of the plurality of repair circuits, the analysis circuit is configured to change the selection information and supply the changed selection information to the holding circuit.

6. The device according to claim 1, wherein the semiconductor device uses the selection circuit as a first selection circuit, and further comprises a second selection circuit, the memory serves as a first memory, and the plurality of memories include a second memory, the first memory is configured to be connectable via the first selection circuit to a first repair circuit and a second repair circuit out of the plurality of repair circuits, and the second memory is configured to be connectable via the second selection circuit to the first repair circuit and a third repair circuit out of the plurality of repair circuits.

7. The device according to claim 6, further comprising a third selection circuit and a fourth selection circuit, wherein the plurality of memories include a third memory and a fourth memory, the third memory is configured to be connectable via the third selection circuit to the second repair circuit and a fourth repair circuit out of the plurality of repair circuits, and the fourth memory is configured to be connectable via the fourth selection circuit to the third repair circuit and the fourth repair circuit out of the plurality of repair circuits.

8. The device according to claim 6, further comprising a fifth selection circuit, wherein the plurality of memories include a fifth memory, the fifth memory is configured to be connectable via the fifth selection circuit to the first repair circuit and the second repair circuit out of the plurality of repair circuits, and the first selection circuit and the fifth selection circuit are controlled to select the same repair circuit out of the plurality of repair circuits.

9. The device according to claim 8, further comprising a sixth selection circuit, wherein the plurality of memories include a sixth memory, the sixth memory is configured to be connectable via the sixth selection circuit to the first repair circuit and the third repair circuit out of the plurality of repair circuits, and the second selection circuit and the sixth selection circuit are controlled to select the same repair circuit out of the plurality of repair circuits.

10. The device according to claim 1, wherein each of the plurality of memories is an SRAM.

11. An apparatus comprising:

the semiconductor device according to claim 1; and a processing device configured to process a signal output from the semiconductor device.

* * * * *